US009967665B2

(12) United States Patent
Das et al.

(10) Patent No.: US 9,967,665 B2
(45) Date of Patent: May 8, 2018

(54) ADAPTATION OF DYNAMIC RANGE ENHANCEMENT BASED ON NOISE FLOOR OF SIGNAL

(71) Applicant: Cirrus Logic International Semiconductor Ltd., Edinburgh (GB)

(72) Inventors: Tejasvi Das, Austin, TX (US); Ku He, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 15/286,289

(22) Filed: Oct. 5, 2016

(65) Prior Publication Data

US 2018/0098149 A1 Apr. 5, 2018

(51) Int. Cl.
| | | |
|---|---|---|
| H04R 1/10 | (2006.01) |
| H04R 3/04 | (2006.01) |
| H03G 3/30 | (2006.01) |
| H03G 3/32 | (2006.01) |
| H03F 3/187 | (2006.01) |

(52) U.S. Cl.
CPC ............ H04R 3/04 (2013.01); H03F 3/187 (2013.01); H03G 3/3089 (2013.01); H03G 3/32 (2013.01); *H03F 2200/78* (2013.01); *H04R 2430/03* (2013.01)

(58) Field of Classification Search
CPC ........ H04R 3/04; H04R 2430/03; H03G 3/32; H03G 3/3089; H03F 3/187; H03F 2200/78
USPC .......... 381/28, 56, 57, 58, 71.1, 71.8, 71.11, 381/71.13, 74, 102, 120
See application file for complete search history.

(56) References Cited

U.S. PATENT DOCUMENTS 4,346,349 A 8/1982 Yokoyama
4,441,081 A 4/1984 Jenkins
(Continued)

FOREIGN PATENT DOCUMENTS

EP 0351788 A2 7/1989
EP 0966105 A2 12/1999
(Continued)

OTHER PUBLICATIONS

International Search Report and Written Opinion of the International Searching Authority, International Application No. PCT/US2016/065134, dated Mar. 15, 2017.
(Continued)

*Primary Examiner* — William A Jerez Lora
(74) *Attorney, Agent, or Firm* — Jackson Walker L.L.P.

(57) ABSTRACT

An analog signal path portion of a signal path may have: (i) an audio input for receiving an analog signal, an audio output for providing an output signal, and a selectable analog gain, and may be configured to generate the output signal based on the analog signal and in conformity with the selectable analog gain; and (ii) a digital path portion having a selectable digital gain and configured to receive a digital input signal and convert the digital input signal into the analog signal in conformity with the selectable digital gain. A control circuit may be configured to modify the digital and analog gains in response to an indication to switch between gain modes of the signal path, determine a noise floor of an audio signal comprising the digital input signal or a signal derived therefrom, and control modification of the digital and analog gains based on the noise floor.

22 Claims, 3 Drawing Sheets

(56) References Cited

U.S. PATENT DOCUMENTS

| | | |
|---|---|---|
| 4,446,440 A | 5/1984 | Bell |
| 4,493,091 A | 1/1985 | Gundry |
| 4,890,107 A | 12/1989 | Pearce |
| 4,972,436 A | 11/1990 | Halim et al. |
| 4,999,628 A | 3/1991 | Kakaubo et al. |
| 4,999,830 A | 3/1991 | Agazzi |
| 5,077,539 A | 12/1991 | Howatt |
| 5,148,167 A | 9/1992 | Ribner |
| 5,198,814 A | 3/1993 | Ogawara et al. |
| 5,272,449 A | 12/1993 | Izawa |
| 5,321,758 A | 6/1994 | Charpentier et al. |
| 5,323,159 A | 6/1994 | Imamura et al. |
| 5,343,161 A | 8/1994 | Tokumo et al. |
| 5,550,923 A | 7/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,796,303 A | 8/1998 | Vinn et al. |
| 5,808,575 A | 9/1998 | Himeno et al. |
| 5,810,477 A | 9/1998 | Abraham et al. |
| 6,088,461 A | 7/2000 | Lin |
| 6,160,455 A | 12/2000 | French et al. |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,614,297 B2 | 9/2003 | Score et al. |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 6,989,955 B2 | 1/2006 | Ziemer et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 | 12/2007 | McNeill et al. |
| 7,315,204 B2 | 1/2008 | Seven |
| 7,365,664 B2 | 4/2008 | Caduff et al. |
| 7,378,902 B2 | 5/2008 | Sorrells et al. |
| 7,385,443 B1 | 6/2008 | Denison |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,737,776 B1 | 6/2010 | Cyrusian |
| 7,893,856 B2 | 2/2011 | Ek et al. |
| 7,924,189 B2 | 4/2011 | Sayers |
| 7,937,106 B2 | 5/2011 | Sorrells et al. |
| 8,060,663 B2 | 11/2011 | Murray et al. |
| 8,130,126 B2 | 3/2012 | Breitschaedel et al. |
| 8,298,425 B2 | 10/2012 | Kanbe |
| 8,330,631 B2 | 12/2012 | Kumar et al. |
| 8,362,936 B2 | 1/2013 | Ledzius et al. |
| 8,462,035 B2 | 6/2013 | Schimper et al. |
| 8,483,753 B2 | 7/2013 | Behzad et al. |
| 8,508,397 B2 | 8/2013 | Hisch |
| 8,717,211 B2 | 5/2014 | Miao et al. |
| 8,786,477 B1 | 7/2014 | Albinet |
| 8,836,551 B2 | 9/2014 | Nozaki |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,201 B2 | 6/2015 | Jones et al. |
| 9,071,267 B1 | 6/2015 | Schneider et al. |
| 9,071,268 B1 | 6/2015 | Schneider et al. |
| 9,118,401 B1* | 8/2015 | Nieto .................. H04B 1/1036 |
| 9,148,164 B1 | 9/2015 | Schneider et al. |
| 9,171,552 B1 | 10/2015 | Yang |
| 9,178,462 B2 | 11/2015 | Kurosawa et al. |
| 9,210,506 B1 | 12/2015 | Nawfal et al. |
| 9,305,658 B2 | 4/2016 | Das et al. |
| 9,337,795 B2 | 5/2016 | Das et al. |
| 9,391,576 B1 | 7/2016 | Satoskar et al. |
| 9,503,027 B2 | 11/2016 | Zanbaghi |
| 9,525,940 B1 | 12/2016 | Schneider et al. |
| 9,543,975 B1 | 1/2017 | Melanson et al. |
| 9,596,537 B2 | 3/2017 | He et al. |
| 9,635,310 B2 | 4/2017 | Chang et al. |
| 9,762,255 B1 | 9/2017 | Satoskar et al. |
| 9,774,342 B1 | 9/2017 | Schneider et al. |
| 9,807,504 B2 | 10/2017 | Melanson et al. |
| 9,813,814 B1 | 11/2017 | Satoskar |
| 9,831,843 B1 | 11/2017 | Das et al. |
| 2001/0001547 A1 | 5/2001 | Delano et al. |
| 2001/0009565 A1 | 7/2001 | Singvall |
| 2004/0078200 A1* | 4/2004 | Alves .................. G10L 21/0208 704/233 |
| 2004/0184621 A1 | 9/2004 | Andersen et al. |
| 2005/0068097 A1 | 3/2005 | Kim et al. |
| 2005/0084037 A1 | 4/2005 | Liang |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0261886 A1 | 11/2006 | Hansen et al. |
| 2006/0284675 A1 | 12/2006 | Krochmal et al. |
| 2007/0018719 A1 | 1/2007 | Seven |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2007/0146069 A1 | 6/2007 | Wu et al. |
| 2008/0012639 A1 | 1/2008 | Mels |
| 2008/0030577 A1 | 2/2008 | Cleary et al. |
| 2008/0114239 A1* | 5/2008 | Randall ................ G01S 7/52073 600/437 |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1* | 11/2008 | Bizjak ...................... H04R 3/00 381/56 |
| 2009/0015327 A1 | 1/2009 | Wu et al. |
| 2009/0021643 A1 | 1/2009 | Hsueh et al. |
| 2009/0051423 A1 | 2/2009 | Miaille et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0168882 A1 | 7/2010 | Zhang et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1* | 8/2011 | Anderson .............. H04B 15/00 381/94.3 |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 | 11/2011 | Walker et al. |
| 2012/0001786 A1 | 1/2012 | Hisch |
| 2012/0047535 A1 | 2/2012 | Bennett et al. |
| 2012/0133411 A1* | 5/2012 | Miao ...................... H03G 3/001 327/306 |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |

(56) References Cited

U.S. PATENT DOCUMENTS

| | | | |
|---|---|---|---|
| 2012/0242521 A1 | 9/2012 | Kinyua | |
| 2012/0250893 A1 | 10/2012 | Carroll et al. | |
| 2012/0263090 A1 | 10/2012 | Porat et al. | |
| 2012/0274490 A1 | 11/2012 | Kidambi et al. | |
| 2012/0280726 A1 | 11/2012 | Colombo et al. | |
| 2013/0095870 A1* | 4/2013 | Phillips | H04W 52/146 455/501 |
| 2013/0106635 A1 | 5/2013 | Doi | |
| 2013/0129117 A1 | 5/2013 | Thomsen et al. | |
| 2013/0188808 A1 | 7/2013 | Pereira et al. | |
| 2013/0241753 A1 | 9/2013 | Nozaki | |
| 2013/0241755 A1 | 9/2013 | Chen et al. | |
| 2014/0044280 A1 | 2/2014 | Jiang | |
| 2014/0105256 A1 | 4/2014 | Hanevich et al. | |
| 2014/0105273 A1 | 4/2014 | Chen et al. | |
| 2014/0126747 A1 | 5/2014 | Huang | |
| 2014/0135077 A1 | 5/2014 | Leviant et al. | |
| 2014/0184332 A1 | 7/2014 | Shi et al. | |
| 2014/0269118 A1 | 9/2014 | Taylor et al. | |
| 2014/0368364 A1 | 12/2014 | Hsu | |
| 2015/0009079 A1 | 1/2015 | Bojer | |
| 2015/0170663 A1* | 6/2015 | Disch | G10L 21/038 704/500 |
| 2015/0214974 A1 | 7/2015 | Currivan | |
| 2015/0214975 A1 | 7/2015 | Gomez et al. | |
| 2015/0249466 A1 | 9/2015 | Elyada | |
| 2015/0295584 A1 | 10/2015 | Das et al. | |
| 2015/0327174 A1 | 11/2015 | Rajagopal et al. | |
| 2015/0381130 A1 | 12/2015 | Das et al. | |
| 2016/0072465 A1 | 3/2016 | Das et al. | |
| 2016/0080862 A1 | 3/2016 | He et al. | |
| 2016/0080865 A1 | 3/2016 | He et al. | |
| 2016/0173112 A1 | 6/2016 | Das et al. | |
| 2016/0181988 A1 | 6/2016 | Du et al. | |
| 2016/0286310 A1 | 9/2016 | Das et al. | |
| 2016/0365081 A1 | 12/2016 | Satoskar et al. | |
| 2017/0047895 A1 | 2/2017 | Zanbaghi | |
| 2017/0150257 A1 | 5/2017 | Das et al. | |
| 2017/0212721 A1 | 7/2017 | Satoskar et al. | |

FOREIGN PATENT DOCUMENTS

| | | |
|---|---|---|
| EP | 1244218 A1 | 9/2002 |
| EP | 1575164 A2 | 9/2005 |
| EP | 1689075 A1 | 8/2006 |
| EP | 1753130 A1 | 2/2007 |
| EP | 1798852 A | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| GB | 2527677 B | 10/2016 |
| GB | 2537694 A | 10/2016 |
| GB | 2537697 A | 10/2016 |
| GB | 2539517 A | 12/2016 |
| JP | 2008294803 A | 12/2008 |
| NO | 2015160655 A1 | 10/2015 |
| WO | WO0054403 A1 | 9/2000 |
| WO | 02/37686 A2 | 5/2002 |
| WO | 2006018750 A1 | 2/2006 |
| WO | 2007005380 A2 | 1/2007 |
| WO | 2007136800 A2 | 11/2007 |
| WO | 2008067260 A1 | 6/2008 |
| WO | 2014113471 A1 | 7/2014 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |
| WO | 2017116629 A1 | 7/2017 |

OTHER PUBLICATIONS

International Search Report and Written Opinion of the International Searching Authority, International Application No. PCT/US2017/014240, dated Apr. 24, 2017.

International Search Report and Written Opinion of the International Searching Authority, International Application No. PCT/US2016/040096, dated Mar. 24, 2017.

Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.

Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Thaden, Rainer et al., A Loudspeaker Management System with FIR/IRR Filtering; AES 32nd International Conference, Hillerod, Denmark, Sep. 21-23, 2007; pp. 1-12.

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, dated Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

Combined Search and Examination Report, GB Application No. GB1510578.6, dated Aug. 3, 2015, 3 pages.

International Search Report and Written Opinion, International Application No. PCT/US2015/056357, dated Jan. 29, 2015, 13 pages.

Combined Search and Examination Report, GB Application No. GB1514512.1, dated Feb. 11, 2016, 7 pages.

International Search Report and Written Opinion, International Application No. PCT/US2015/048609, dated Mar. 23, 2016, 23 pages.

International Search Report and Written Opinion, International Application No. PCT/US2016/022578, dated Jun. 22, 2016, 12 pages.

Combined Search and Examination Report, GB Application No. GB1600528.2, dated Jul. 7, 2016, 8 pages.

Combined Search and Examination Report, GB Application No. GB1603628.7, dated Aug. 24, 2016, 6 pages.

International Search Report and Written Opinion, International Application No. PCT/EP2016/062862, dated Aug. 26, 2016, 14 pages.

Combined Search and Examination Report, GB Application No. GB1602288.1, dated Aug. 9, 2016, 6 pages.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3), United Kingdom Intellectual Property Office, Application No. GB1700371.6, dated Aug. 1, 2017.

Combined Search and Examination Report under Sections 17 and 18(3), United Kingdom Intellectual Property Office, Application No. GB1702540.4, dated Oct. 2, 2017.

Combined Search and Examination Report under Sections 17 and 18(3), United Kingdom Intellectual Property Office, Application No. GB1702655.0, dated Oct. 24, 2017.

(56) References Cited

OTHER PUBLICATIONS

Combined Search and Examination Report under Sections 17 and 18(3), United Kingdom Intellectual Property Office, Application No. GB1706693.7, dated Oct. 26, 2017.
Combined Search and Examination Report under Sections 17 and 18(3), United Kingdom Intellectual Property Office, Application No. GB1706690.3, dated Oct. 30, 2017.
Search Report under Section 17, United Kingdom Intellectual Property Office, Application No. GB1702656.8, dated Oct. 31, 2017.
International Search Report and Written Opinion of the International Searching Authority, International Patent Application No. PCT/US2017/045861, dated Nov. 14, 2017.
International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.
Combined Search and Examination Report under Sections 17 and 18(3), United Kingdom Intellectual Property Office, Application No. GB1708544.0, dated Nov. 28, 2017.
International Search Report and Written Opinion of the International Searching Authority, International Patent Application No. PCT/US2017/052439, dated Dec. 14, 2017.
Chen, Kuo-Hsin, et al., A 106dB PSRR Direct Battery Connected Reconfigurable Class-AB/D Speaker Amplifier for Hands-Free/Receiver 2-in-1 Loudspeaker, Solid State Circuits Conference (A-SSCC), 2011 IEEE Asian, Nov. 14, 2011, pp. 221-224.

\* cited by examiner

ADAPTATION OF DYNAMIC RANGE ENHANCEMENT BASED ON NOISE FLOOR OF SIGNAL

FIELD OF DISCLOSURE

The present disclosure relates in general to circuits for audio devices, including without limitation personal audio devices, such as wireless telephones and media players, and more specifically, to systems and methods for adapting an application of dynamic range enhancement to an audio signal path in an audio device based on a noise floor of a signal.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device, which may affect its marketability and desirability, is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of the power amplifier, such that any increased dynamic range as a result of a high-gain amplifier may be offset by signal noise which may effectively mask lower-intensity audio signals.

U.S. patent application Ser. No. 14/083,972, filed Nov. 19, 2013, entitled "Enhancement of Dynamic Range of Audio Signal Path," and assigned to the applicant (Cirrus Logic, Inc.) of the present disclosure (the "'972 Application") discloses methods and systems for enhancing the dynamic range of an audio signal path. In the '972 Application, an apparatus for providing an output signal to an audio transducer includes an analog signal path portion, a digital-to-analog converter (DAC), and a control circuit. The analog signal path portion has an audio input for receiving an analog signal, an audio output for providing the output signal, and a selectable analog gain, and may be configured to generate the output signal based on the analog signal and in conformity with the selectable analog gain. The DAC has a selectable digital gain and may be configured to convert a digital audio input signal into the analog signal in conformity with the selectable digital gain. The control circuit may be configured to select the selectable analog gain and select the selectable digital gain based on a magnitude of a signal indicative of the output signal.

SUMMARY

In accordance with the teachings of the present disclosure, one or more disadvantages and problems associated with existing approaches to dynamic range enhancement of an audio signal path may be reduced or eliminated.

In accordance with embodiments of the present disclosure, an apparatus for providing an output signal to an audio transducer may include a signal path and a control circuit. The signal path may include an analog signal path portion having an audio input for receiving an analog signal, an audio output for providing an output signal, and a selectable analog gain, and configured to generate the output signal based on the analog signal and in conformity with the selectable analog gain and a digital path portion having a selectable digital gain and configured to receive a digital input signal and convert the digital input signal into the analog signal in conformity with the selectable digital gain. The control circuit may be configured to modify the selectable digital gain and the selectable analog gain in response to an indication to switch between gain modes of the signal path, determine a noise floor of an audio signal comprising the digital input signal or a signal derived therefrom, and control modification of the selectable digital gain and the selectable analog gain based on the noise floor.

In accordance with these and other embodiments of the present disclosure, a method may include a signal path comprising an analog signal path portion having an audio input for receiving an analog signal, an audio output for providing an output signal, and a selectable analog gain, and configured to generate the output signal based on the analog signal and in conformity with the selectable analog gain and further comprising a digital path portion having a selectable digital gain and configured to receive a digital input signal and convert the digital input signal into the analog signal in conformity with the selectable digital gain, modifying the selectable digital gain and the selectable analog gain in response to an indication to switch between gain modes of the signal path. The method may also include determining a noise floor of an audio signal comprising the digital input signal or a signal derived therefrom and controlling modification of the selectable digital gain and the selectable analog gain based on the noise floor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The digital path portion may be configured to receive a digital input signal (e.g., a digital audio signal), apply a selectable digital gain x to the digital input signal, and convert the digital input signal (e.g., via a digital-to-analog converter) to an analog signal in conformity with the selectable digital gain. The analog path portion may be configured to receive the analog signal and apply (e.g., by an analog amplifier) a selectable analog gain k/x to the analog signal to generate an output signal, wherein said output signal may be communicated to a loudspeaker for playback and/or to other circuitry for processing. The numerator k of the selectable analog gain may be a constant defining an overall cumulative gain of the signal path. A control circuit coupled to the signal path may be capable of modifying the selectable digital gain and the selectable analog gain, for example to maximize a dynamic range of the signal path. For example, based on analysis of the output signal or another signal within the signal path indicative of the output signal, the control circuit may select a value for the selectable digital gain and a corresponding value for the selectable analog gain. Thus, for lower magnitudes of the output signal, the control circuit may select a higher selectable digital gain and a lower selectable analog gain, and for higher magnitudes of the output signal, the control circuit may select a lower selectable digital gain and a higher selectable analog gain. Such selectable gains may allow a signal path to increase its dynamic range to lower-magnitude signals, while preventing undesirable effects such as signal clipping for higher-magnitude signals. In operation, the control circuit may also be configured to predict, based on a magnitude of a signal indicative of the output signal, a condition for changing the selectable digital gain and the selectable analog gain, and responsive to predicting the occurrence of the condition, change, at an approximate time in which a zero crossing of the signal indicative of the output signal occurs, the selectable digital gain and the selectable analog gain.

Figure 1:
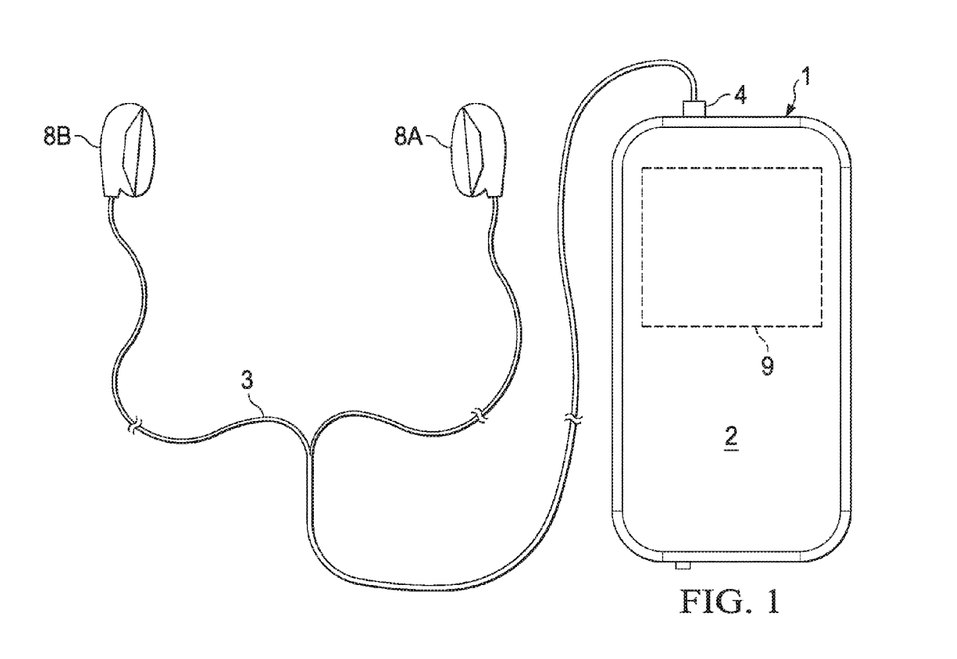
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
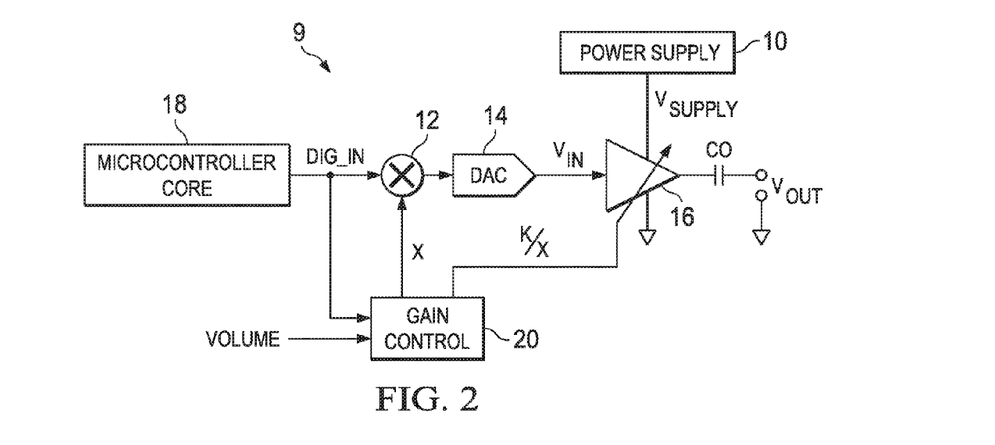
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital gain element 12 to apply a selectable digital gain x selected by gain control 20 to the digital input signal DIG_IN. The amplified digital audio input signal may be communicated to a digital-to-analog converter (DAC) 14, which may convert the digital audio input signal to an analog signal $V_{IN}$. Together, digital gain element 12 and DAC 14 may be referred to herein as a digital path portion of the signal path from the input node for digital audio input signal DIG_IN to the output node for output voltage signal $V_{OUT}$ depicted in FIG. 2. In the relevant art, digital gain element 12 and DAC 14 may sometimes be referred to as an audio compressor.

DAC 14 may supply analog signal $V_{IN}$ to an amplifier stage 16 which may amplify or attenuate audio input signal $V_{IN}$ in conformity with a selectable analog gain k/x to provide an audio output signal $V_{OUT}$, which may operate a speaker, headphone transducer, a line level signal output, and/or other suitable output. Amplifier stage 16 may be referred to herein as an analog path portion of the signal path from the input node for digital audio input signal DIG_IN to the output node for output voltage signal $V_{OUT}$ depicted in FIG. 2. In the relevant art, amplifier stage 16 may sometimes be referred to as an audio expander. A capacitor CO may be utilized to couple the output signal to the transducer or line level output, particularly if amplifier stage 16 is operated from a unipolar power supply having a quiescent voltage substantially differing from ground. A power supply 10 may provide the power supply rail inputs of amplifier stage 16.

As shown in FIG. 2, audio IC 9 may include a gain control circuit 20 configured to, based on digital audio input signal DIG_IN, control selectable digital gain x of gain element 12 and a selectable analog gain k/x of amplifier stage 16. In embodiments in which a volume control is present, a volume control signal may be provided from a microcontroller or other digital control circuit responsive to a user interface, volume knob encoder or program command, or other suitable mechanism.

As an example of the dynamic range enhancement functionality of audio IC 9, when digital audio input signal DIG_IN is at or near zero decibels (0 dB) relative to the full-scale voltage of the digital audio input signal, gain control circuit 20 may select a first digital gain (e.g., $x_1$) for the selectable digital gain and a first analog gain (e.g., $k/x_1$) for the selectable analog gain. However, if the magnitude of digital audio input signal DIG_IN is below a particular predetermined threshold magnitude relative to the full-scale voltage of digital audio input signal DIG_IN (e.g., −20 dB), gain control circuit 20 may select a second digital gain (e.g., $x_2$) greater than the first digital gain (e.g., $x_2 > x_1$) for the selectable digital gain and a second analog gain (e.g., $k/x_2$) lesser than the first analog gain (e.g., $k/x_2 < k/x_1$) for the selectable analog gain. In each case, the cumulative path gain (e.g., k) of the selectable digital gain and the selectable analog gain may be substantially constant (e.g., the same within manufacturing and/or operating tolerances of audio IC 9). In some embodiments, k may be approximately equal to 1, such that the cumulative path gain is a unity gain. Such modification of digital gain and analog gain may increase the dynamic range of audio IC 9 compared to approaches in which the digital gain and analog gain are static, as it may reduce the noise injected into audio output signal $V_{OUT}$, which noise may be a generally monotonically increasing function of the analog gain of amplifier stage 16. While such noise may be negligible for higher magnitude audio signals (e.g., at or near 0 dB relative to full-scale voltage), the presence of such noise may become noticeable for lower magnitude audio signals (e.g., at or near −20 dB or lower relative to full-scale voltage). By applying a smaller analog gain at amplifier stage 16 for smaller signal magnitudes, the amount of noise injected into audio output signal $V_{OUT}$ may be reduced, while the signal level of audio output signal $V_{OUT}$ may be maintained in accordance with the digital audio input signal DIG_IN through application of a digital gain to gain element 12 inversely proportional to the analog gain.

Figure 3:
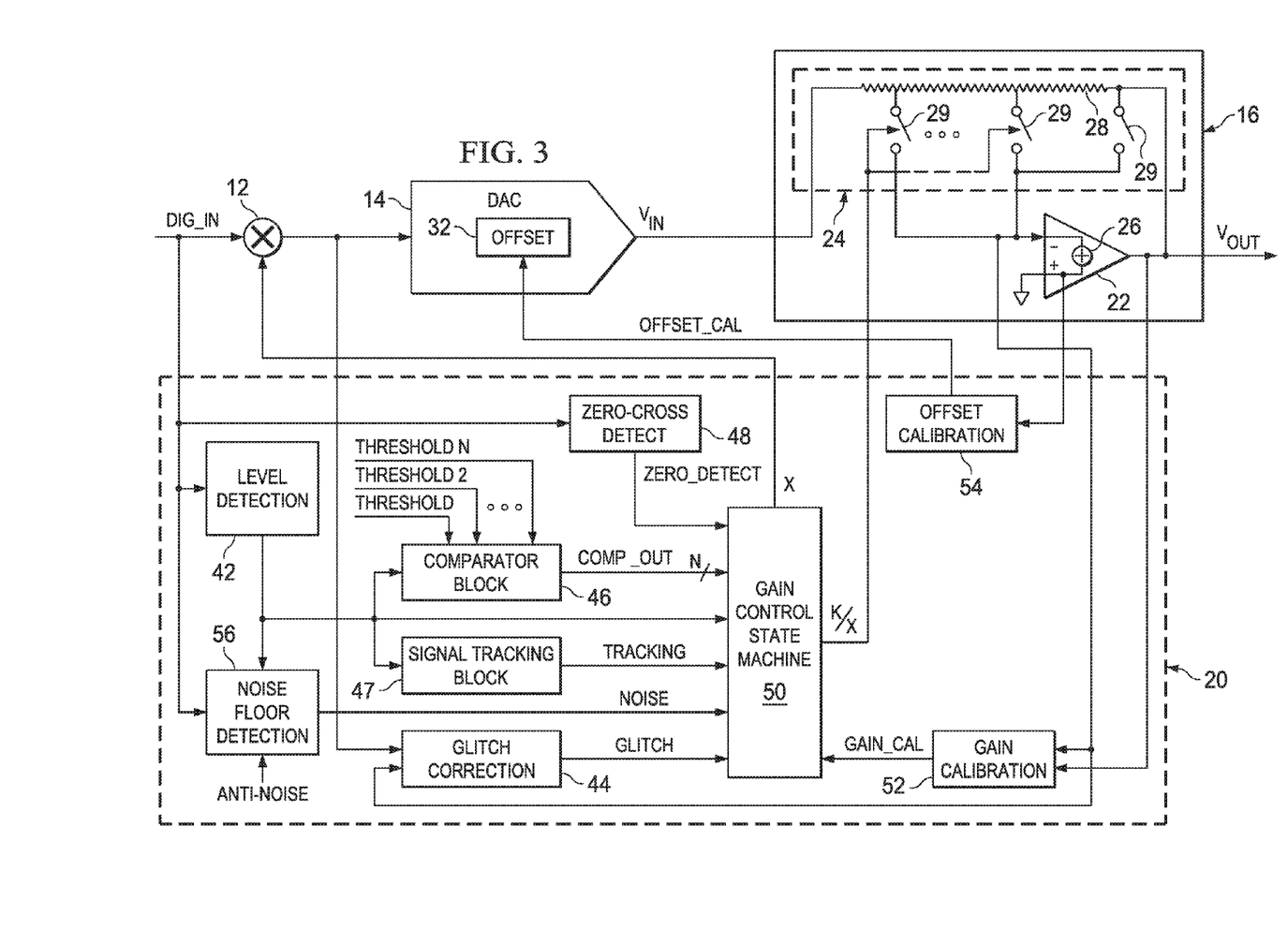
FIG. 3 is a block diagram of selected components of an example gain control circuit for use within the audio integrated circuit depicted in FIG. 2, and selected components of an audio integrated circuit which may be coupled to the gain control circuit, in accordance with embodiments of the present disclosure.

FIG. 3 is a block diagram of selected components of an example gain control circuit 20 for use within audio IC 9, and selected components of audio IC 9 which may be coupled to gain control circuit 20, in accordance with embodiments of the present disclosure. As shown in FIG. 3, gain control circuit 20 may include a level detection circuit 42, a comparator block 46, a signal tracking block 47, a zero-cross detection circuit 48, a glitch correction circuit 44, a gain calibration circuit 52, an offset calibration circuit 54, a noise floor detection circuit 56, and a gain control state machine 50. Level detection circuit 42 may include any suitable system, device, or apparatus for receiving digital audio input signal DIG_IN (or a derivative thereof), determining a magnitude of such signal, and outputting a signal indicative of such magnitude. Comparator block 46 may compare the output signal of level detection circuit 42 with N predetermined threshold magnitudes, wherein N is a positive integer, and based on such comparison, output a signal COMP_OUT (which may comprise N bits) indicative of whether the desired magnitude of audio output signal $V_{OUT}$ is greater or lesser than each of such predetermined threshold magnitudes. In some embodiments, such predetermined threshold magnitudes may be relative to a full-scale voltage of digital audio input signal DIG_IN and/or audio output signal $V_{OUT}$. In some embodiments, comparator block 46 may implement hysteresis, such that signal COMP_OUT or a bit thereof may only transition if the output signal of level detection block 42 remains above or below a predetermined threshold magnitude for a minimum duration of time (e.g., 0.1 seconds to place any switching artifacts outside the human-perceptible audio range).

Zero-cross detection circuit 48 may include any suitable system, device, or apparatus for detecting the occurrence of a zero crossing of a digital audio input signal (or a derivative thereof) and outputting a signal ZERO_DETECT indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or within a small number of least significant bits of zero).

Signal tracking block 47 may comprise any suitable system, device, or apparatus for tracking a particular parameter of an audio signal, including without limitation a plurality of peaks of such audio signal and/or a signal envelope of such audio signal, and based thereon, generate an output signal TRACKING indicative of such tracked parameter.

Glitch correction circuit 44 may comprise any suitable system, device, or apparatus for correcting for a latency or group delay between the output of gain element 12 and the input of amplifier stage 16. Such glitch correction may account for a change of the selectable digital gain of gain element 12 which requires a latency to propagate to amplifier stage 16 where a corresponding selectable analog gain may be applied. Without such correction, the latency of group delay may cause audio artifacts to appear at the output of the signal path.

Gain calibration circuit 52 may comprise any suitable system, device, or apparatus for correcting for a non-ideal gain of amplifier stage 16. To illustrate, amplifier stage 16 may comprise an operational amplifier 22 and a switched resistor network 24 comprising a resistor string 28 having a plurality of taps each coupled to a corresponding switch 29. To apply a desired selectable analog gain to amplifier stage 16, switches 29 may be selectively opened and closed to create an effective resistance between a negative input of operational amplifier 22 and the output of operational amplifier 22, wherein the selectable analog gain of operational amplifier 22 is based on such effective resistance. However, due to non-idealities of amplifier stage 16 (e.g., temperature variations, process tolerances, etc.), an actual gain of amplifier stage 16 may differ from that of a desired level of gain determined by gain control state machine 50. Accordingly, gain calibration circuit 52 may determine the actual gain of amplifier stage 16 and output a signal GAIN_CAL indicative of such actual gain, and gain control state machine 50 may correct for non-idealities in selecting the selectable digital gain.

Offset calibration circuit 54 may comprise any suitable system, device, or apparatus for correcting for an offset of amplifier stage 16. To illustrate, operational amplifier 22 may include, due to non-idealities of amplifier stage 16 (e.g., temperature variations, process tolerances, etc.), a slight offset 26 from a desired ground or common mode voltage associated with amplifier stage 16, which may affect signal output $V_{OUT}$. Accordingly, offset calibration circuit 54 may determine the offset 26 of amplifier stage 16 and output a signal OFFSET_CAL, which may be communicated to an offset block 32 of DAC 14 such that DAC 14 may correct for such analog offset.

Figure 4:
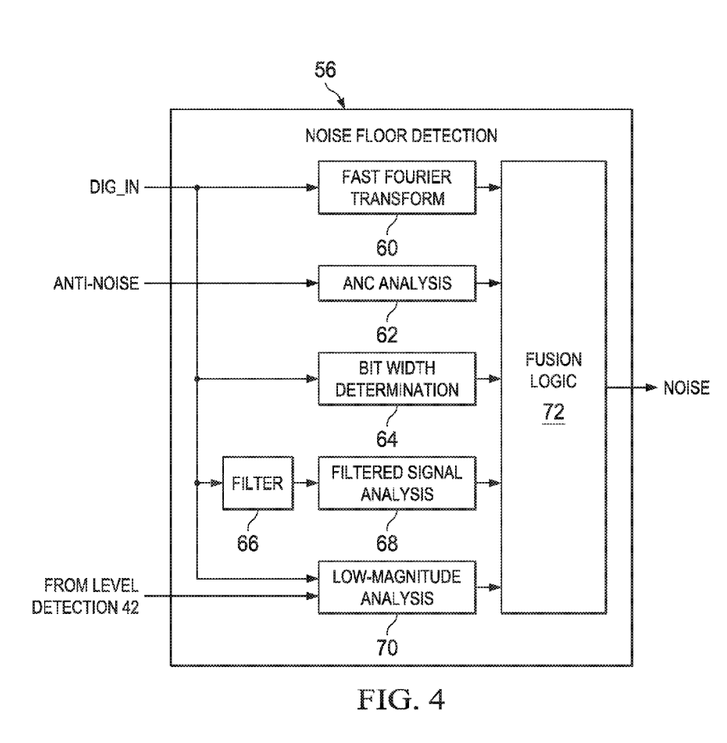
FIG. 4 is a block diagram of selected components of an example noise floor detection circuit for use within the gain control circuit depicted in FIG. 3, in accordance with embodiments of the present disclosure.

Noise floor detection circuit 56 may comprise any suitable system, device, or apparatus for detecting a noise floor associated with digital audio input signal DIG_IN (or a derivative thereof), and generating a signal NOISE indicative of such detected noise floor. FIG. 4 is a block diagram of selected components of an example noise floor detection circuit 56, in accordance with embodiments of the present disclosure. As shown in FIG. 4, in some embodiments, noise floor detection circuit 56 may include a fast Fourier transform block 60 configured to determine the noise floor of digital audio input signal DIG_IN (or a derivative thereof) by performing a fast Fourier transform of the audio signal. In these and other embodiments, as shown in FIGS. 3 and 4, noise floor detection circuit 56 may receive a signal ANTI-NOISE indicative of an adaptive noise cancellation anti-noise signal present in digital audio input signal DIG_IN, and utilize an adaptive noise cancellation (ANC) analysis block 62 to determine the noise floor of digital audio input signal DIG_IN (or a derivative thereof) by determining a noise characteristic (e.g., signal-to-noise ratio, noise floor, etc.) of such anti-noise signal. In these and other embodiments, as shown in FIG. 4, noise floor detection circuit 56 may include a bit width determination block 64 configured to determine the noise floor of digital audio input signal DIG_IN (or a derivative thereof) by determining a bit width (e.g., number of digital bits) of digital audio input signal DIG_IN (or a derivative thereof), as the noise floor of digital audio input signal DIG_IN is limited by its resolution.

In these and other embodiments, as shown in FIG. 4, noise floor detection circuit 56 may include a filter 66 and filtered signal analysis block 68. In such embodiments, gain control circuit 20 may, in connection with microcontroller core 18, cause digital audio input signal DIG_IN (or a derivative thereof) to have known characteristics (e.g., generate a test signal with known spectral content). In operation, filter 66 may filter digital audio input signal DIG_IN (or a derivative thereof) to generate a filtered audio signal having frequencies with high spectral content filtered out, and filtered signal analysis block 68 may analyze the filtered audio signal, which may be expected to have a low magnitude across its entire frequency range, to determine the noise floor.

In these and other embodiments, noise floor detection circuit 56 may include a low-magnitude analysis block 70 configured to determine the noise floor of the audio signal by analyzing the audio signal during a period of time when digital audio input signal DIG_IN (or a derivative thereof) is expected to have a low or zero amplitude (e.g., as indicated by a signal generated by level detection circuit 42) and determining the noise floor based on such analysis.

As shown in FIG. 4, noise floor detection circuit 56 may also include a fusion logic block 72 configured to, based on the noise floor levels output by each of fast Fourier transform block 60, adaptive noise cancellation (ANC) analysis block 62, bit width determination block 64, filtered signal analysis block 68, and low-magnitude analysis block 70, determine an estimated noise floor of digital audio input signal DIG_IN (or a derivative thereof) and output a signal NOISE indicative of such determined estimated noise floor. In some embodiments, fusion logic block 72 may simply select the highest noise floor level of the noise floor levels output by each of fast Fourier transform block 60, adaptive noise cancellation (ANC) analysis block 62, bit width determination block 64, filtered signal analysis block 68, and low-magnitude analysis block 70.

Although FIG. 4 depicts noise floor detection circuit 56 comprising fast Fourier transform block 60, adaptive noise cancellation (ANC) analysis block 62, bit width determination block 64, filtered signal analysis block 68, and low-magnitude analysis block 70, in some embodiments, noise floor detection circuit 56 may not include one or more of fast Fourier transform block 60, adaptive noise cancellation (ANC) analysis block 62, bit width determination block 64, filtered signal analysis block 68, and low-magnitude analysis block 70. In some of such embodiments, noise floor detection circuit 56 may include only one of fast Fourier transform block 60, adaptive noise cancellation (ANC) analysis block 62, bit width determination block 64, filtered signal analysis block 68, and low-magnitude analysis block 70, in which case noise floor detection circuit 56 may not include fusion logic block 72.

Turning again to FIG. 3, gain control state machine 50 may receive signals COMP_OUT, TRACKING, ZERO_DETECT, GLITCH, GAIN_CAL, and/or NOISE and based on one or more of such signals, generate the selectable digital gain and the selectable analog gain, as described in greater detail elsewhere in this disclosure. For example, when the magnitude of digital audio input signal DIG_IN transitions from above to below a predetermined threshold magnitude (e.g., −24 dB), signal COMP_OUT may indicate such transition and in response, gain control state machine 50 may wait until the occurrence of a zero crossing (as indicated by signal ZERO_DETECT), after which it may cause DAC 14 to increase the selectable digital gain and decrease the selectable audio gain a similar amount. By changing the selectable digital gain and the selectable audio gain at a zero crossing of digital audio input signal DIN_IN (or a derivative thereof), the change and any auditory artifacts associated with the change may be masked and therefore unnoticeable or less noticeable to a listener of an audio device including audio IC 9.

As another example, when the sum of the magnitude of digital audio input signal DIG_IN transitions from below to above a predetermined threshold magnitude (e.g., −24 dB), signal COMP_OUT may indicate such transition, and in response gain control state machine 50 may cause DAC 14 to decrease the selectable digital gain and increase the selectable audio gain in a similar amount. However, when transitioning to lower digital gain mode, it may not be desirable to wait for a zero cross of the output signal, as a transition from below to above the predetermined threshold magnitude may almost immediately lead to clipping of the audio signal. Accordingly, it may be desirable to predict whether the magnitude of digital audio input signal DIG_IN is likely to cross such predetermined threshold and modify the selectable digital gain and the selectable analog gain responsive to such prediction at a zero crossing event of the digital audio input signal DIG_IN occurring before crossing of the predetermined threshold by the digital audio input signal DIG_IN. By applying such predictive techniques, examples of which are explained in U.S. patent application Ser. No. 15/244,670 entitled "Enhancing Dynamic Range Based on Spectral Content of Signal," and filed on Aug. 23, 2016, gain control circuit 20 may facilitate switching between gain modes to increase dynamic range while reducing audio artifacts.

In these and other embodiments, gain control circuit 20 may reduce audio artifacts associated with switching between a non-unity gain mode and a unity gain mode by implementing three or more intermediate dynamic range modes having step sizes between the various dynamic range modes. For instance, in some embodiments, gain control circuit 20 may implement eight intermediate dynamic range modes wherein the selectable digital gains have step sizes of 3 dB between the various modes such that the various modes have selectable digital gains of −24 dB, −21 dB, −18 dB, −15 dB, −12 dB, −9 dB, −6 dB, −3 dB and 0 dB and respective selectable analog gains of 24 dB, 21 dB, 18 dB, 15 dB, 12 dB, 9 dB, 6 dB, 3 dB and 0 dB. Thus, in response to the magnitude of the output signal crossing a relevant threshold, gain control circuit 20 may cause the selectable digital gain to change from its minimum to maximum value, and cause the selectable digital gain to change from its maximum to minimum value in a series of steps, wherein each step may occur after a predetermined period of time. In addition, in some embodiments, gain control circuit 20 may be configured to transition between the respective gain modes and a plurality of respective predetermined threshold magnitude levels. For example, gain control circuit 20 may transition between the −24 dB gain mode and the −21 dB gain mode in response to the magnitude of the output signal crossing −24 dB, may transition between the −21 dB mode and the −18 dB mode in response to the magnitude of the output signal crossing −21 dB, may transition between the −18 dB mode and the −15 dB mode in response to the magnitude of the output signal crossing −18 dB, and so on. In these embodiments, gain control circuit 20 may also be configured to, using some or all of the methods previously described, predict a crossing of a particular threshold level, and based on such predicting, switch between the various modes at approximate occurrence of a zero crossing of the output signal, so as to reduce audio artifacts.

In addition or alternatively to the embodiments discussed above, gain control circuit 20 may be configured to predict when digital audio input signal DIG_IN crosses a primary threshold by receiving digital audio input signal DIG_IN and processing such signal before the signal propagates to gain element 12 and amplifier stage 16, such that gain control circuit 20 may determine and apply the desired selectable digital gain and selectable audio gain at or before the signal propagates to such gain elements.

In addition or alternatively to the functionality described above, gain control state machine 50 may also control modification of the selectable digital gain and the selectable analog gain based on the noise floor signal NOISE communicated from noise floor detection circuit 56. To illustrate, in situations when a noise floor of digital audio input signal DIG_IN is relatively high, dynamic range enhancement provided by modifying of the selectable digital gain and the selectable analog gain may be limited, as dynamic range enhancement may be unable to improve the noise floor already present in digital audio input signal DIG_IN. Accordingly, in such scenarios in which application of dynamic range enhancement by modifying of the selectable digital gain and the selectable analog gain has limited or no effect in increasing signal quality, gain control state machine 50 may control the modification of the selectable digital gain and the selectable analog gain to limit the application of dynamic range enhancement in audio IC 9.

For example, in some embodiments, gain control state machine 50 may control modification of the selectable digital gain and the selectable analog gain based on the noise floor by limiting ranges of the selectable digital gain and the selectable analog gain based on the noise floor. To illustrate, the noise floor of digital audio input signal DIG_IN may be such that no improvement of signal quality may occur above a particular value of the selectable digital gain intermediate to the minimum and maximum selectable digital gain, and thus, gain control state machine 50 may limit the selectable digital gain to such particular value, and similarly limit the selectable analog gain. In some instances, the noise floor of digital audio input signal DIG_IN may be such that no improvement of signal quality may occur above the minimum selectable digital gain, in which case gain control state machine 50 may limit the selectable digital gain to its minimum value, and the selectable analog gain to its maximum value.

As another example, in these and other embodiments, gain control state machine 50 may control modification of the selectable digital gain and the selectable analog gain based on the noise floor by controlling a switching time of modifying at least one of the selectable digital gain and the selectable analog gain based on the noise floor. Control of a switching time may allow for switching at an "optimal" time in order to reduce or eliminate audile artifacts caused by the switching while also preventing signal clipping.

As another example, in these and other embodiments, gain control state machine 50 may control modification of the selectable digital gain and the selectable analog gain based on the noise floor by controlling a step size of a change of at least one of the selectable digital gain and the selectable analog gain during the switching between gain modes based on the noise floor. Control of step size may reduce or eliminate audible artifacts associated with switching and minimize unnecessary switching between gain modes.

As an additional example, in these and other embodiments, gain control state machine 50 may control modification of the selectable digital gain and the selectable analog gain based on the noise floor by delaying modification of the selectable digital gain and the selectable analog gain based on the noise floor. For instance, in some situations, other signals communicated to gain control state machine 50 (e.g., change in magnitude of digital audio input signal DIG_IN, a zero-crossing of digital audio input signal DIG_IN, etc.) may provide an indication to switch between gain modes. However, if the noise floor of digital audio input signal DIG_IN is such that no improvement in signal quality may occur from such switch between gain modes, gain control state machine 50 may delay such switch until such time that the noise floor of digital audio input signal DIG_IN improves to a level in which such switch would affect signal quality.

As an additional example, in these and other embodiments, gain control state machine 50 may control modification of the selectable digital gain and the selectable analog gain based on the noise floor by ceasing switching between gain modes based on the noise floor. For instance, in some situations, other signals communicated to gain control state machine 50 (e.g., change in magnitude of digital audio input signal DIG_IN, a zero-crossing of digital audio input signal DIG_IN, etc.) may provide an indication to switch between gain modes. However, if the noise floor of digital audio input signal DIG_IN is such that no improvement in signal quality may occur from such switch between gain modes, gain control state machine 50 may cease any switching between gain modes.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus for providing an output signal to an audio transducer, comprising:
   a signal path comprising:
      an analog signal path portion having an audio input for receiving an analog signal, an audio output for providing an output signal, and a selectable analog gain, and configured to generate the output signal based on the analog signal and in conformity with the selectable analog gain; and
      a digital path portion having a selectable digital gain and configured to receive a digital input signal and convert the digital input signal into the analog signal in conformity with the selectable digital gain; and a control circuit configured to:
modify the selectable digital gain and the selectable analog gain in response to an indication to switch between gain modes of the signal path;
determine a noise floor of an audio signal comprising the digital input signal or a signal derived therefrom; and
control modification of the selectable digital gain and the selectable analog gain based on the noise floor.

2. The apparatus of claim 1, wherein the control circuit is configured to determine the noise floor of the audio signal by performing a fast Fourier transform of the audio signal to determine the noise floor.

3. The apparatus of claim 1, wherein the control circuit is configured to determine the noise floor of the audio signal by determining a noise characteristic of an adaptive noise cancellation anti-noise signal present in the digital input signal.

4. The apparatus of claim 1, wherein the control circuit is configured to determine the noise floor of the audio signal by determining a bit width of the audio signal.

5. The apparatus of claim 1, wherein the control circuit is configured to determine the noise floor of the audio signal by:
causing the audio signal to have known characteristics;
filtering the audio signal to generate a filtered audio signal; and
determining the noise floor based on the filtered audio signal.

6. The apparatus of claim 1, wherein the control circuit is configured to determine the noise floor of the audio signal by analyzing the audio signal during a period of time when the audio signal is expected to have a low or zero amplitude and determining the noise floor based on such analysis.

7. The apparatus of claim 1, wherein the control circuit is configured to control modification of the selectable digital gain and the selectable analog gain based on the noise floor by limiting ranges of the selectable digital gain and the selectable analog gain based on the noise floor.

8. The apparatus of claim 1, wherein the control circuit is configured to control modification of the selectable digital gain and the selectable analog gain based on the noise floor by controlling a switching time of at least one a modification of the selectable digital gain and a modification the selectable analog gain based on the noise floor.

9. The apparatus of claim 1, wherein the control circuit is configured to control modification of the selectable digital gain and the selectable analog gain based on the noise floor by controlling a step size of a change of at least one of the selectable digital gain and the selectable analog gain during the switching of the gain mode based on the noise floor.

10. The apparatus of claim 1, wherein the control circuit is configured to control modification of the selectable digital gain and the selectable analog gain based on the noise floor by delaying modification of the selectable digital gain and the selectable analog gain based on the noise floor.

11. The apparatus of claim 1, wherein the control circuit is configured to control modification of the selectable digital gain and the selectable analog gain based on the noise floor by cessation of switching between gains modes.

12. A method comprising:
in a signal path comprising an analog signal path portion having an audio input for receiving an analog signal, an audio output for providing an output signal, and a selectable analog gain, and configured to generate the output signal based on the analog signal and in conformity with the selectable analog gain and further comprising a digital path portion having a selectable digital gain and configured to receive a digital input signal and convert the digital input signal into the analog signal in conformity with the selectable digital gain, modifying the selectable digital gain and the selectable analog gain in response to an indication to switch between gain modes of the signal path;
determining a noise floor of an audio signal comprising the digital input signal or a signal derived therefrom; and
controlling modification of the selectable digital gain and the selectable analog gain based on the noise floor.

13. The method of claim 12, wherein determining the noise floor of the audio signal comprises performing a fast Fourier transform of the audio signal to determine the noise floor.

14. The method of claim 12, wherein determining the noise floor of the audio signal comprises determining a noise characteristic of an adaptive noise cancellation anti-noise signal present in the digital input signal.

15. The method of claim 12, wherein determining the noise floor of the audio signal comprises determining a bit width of the audio signal.

16. The method of claim 12, wherein determining the noise floor of the audio signal comprises:
causing the audio signal to have known characteristics;
filtering the audio signal to generate a filtered audio signal; and
determining the noise floor based on the filtered audio signal.

17. The method of claim 12, wherein determining the noise floor of the audio signal comprises analyzing the audio signal during a period of time when the audio signal is expected to have a low or zero amplitude and determining the noise floor based on such analysis.

18. The method of claim 12, wherein controlling modification of the selectable digital gain and the selectable analog gain based on the noise floor comprises limiting ranges of the selectable digital gain and the selectable analog gain based on the noise floor.

19. The method of claim 12, wherein controlling modification of the selectable digital gain and the selectable analog gain based on the noise floor comprises controlling a switching time of at least one a modification of the selectable digital gain and a modification the selectable analog gain based on the noise floor.

20. The method of claim 12, wherein controlling modification of the selectable digital gain and the selectable analog gain based on the noise floor comprises controlling a step size of a change of at least one of the selectable digital gain and the selectable analog gain during the switching of the gain mode based on the noise floor.

21. The method of claim 12, wherein controlling modification of the selectable digital gain and the selectable analog gain based on the noise floor comprises delaying modification of the selectable digital gain and the selectable analog gain based on the noise floor.

22. The method of claim 12, wherein controlling modification of the selectable digital gain and the selectable analog gain based on the noise floor comprises cessation of switching between gains modes.

* * * * *

UNITED STATES PATENT AND TRADEMARK OFFICE
CERTIFICATE OF CORRECTION

PATENT NO. : 9,967,665 B2
APPLICATION NO. : 15/286289
DATED : May 8, 2018
INVENTOR(S) : Das et al.

It is certified that error appears in the above-identified patent and that said Letters Patent is hereby corrected as shown below:

In the Claims

Column 11, Line 42, Please amend Claim 8 as follows:
8. The apparatus of Claim 1, wherein the control circuit is configured to control modification of the selectable digital gain and the selectable analog gain based on the noise floor by controlling a switching time of at least one of a modification of the selectable digital gain and a modification of the selectable analog gain based on the noise floor.

Column 12, Line 45, Please amend Claim 19 as follows:
19. The method of Claim 12, wherein controlling modification of the selectable digital gain and the selectable analog gain based on the noise floor comprises controlling a switching time of at least one of a modification of the selectable digital gain and a modification of the selectable analog gain based on the noise floor.

Signed and Sealed this
Nineteenth Day of February, 2019

Andrei Iancu
*Director of the United States Patent and Trademark Office*